United States Patent [19]

Sakamoto et al.

[11] Patent Number: 5,118,952
[45] Date of Patent: Jun. 2, 1992

[54] PATTERNED PHOTO CATHODE AND ITS FABRICATION METHOD FOR ELECTRON IMAGE PROJECTION

[75] Inventors: Kiichi Sakamoto, Tokyo; Hiroshi Yasuda, Yokohama; Jinko Kudou; Akio Yamada, both of Kawasaki, all of Japan

[73] Assignee: Fujitsu Limited, Kanagawa, Japan

[21] Appl. No.: 605,008

[22] Filed: Oct. 24, 1990

Related U.S. Application Data

[63] Continuation of Ser. No. 86,510, Aug. 18, 1987, abandoned.

[30] Foreign Application Priority Data

Aug. 18, 1986 [JP] Japan ................ 61-192448

[51] Int. Cl.⁵ .................. H01J 37/00; H01J 40/06
[52] U.S. Cl. ............... 250/492.2; 250/503.1; 313/542
[58] Field of Search ........... 250/492.22, 492.24, 250/492.3, 503.1; 430/5, 296; 313/542, 543, 544, 530

[56] References Cited

U.S. PATENT DOCUMENTS

| | | | |
|---|---|---|---|
| 1,901,577 | 3/1933 | Bainbridge | 313/544 |
| 2,139,018 | 12/1938 | Heimann | 313/373 |
| 2,172,164 | 9/1939 | Gorlich | 427/74 |
| 2,175,888 | 10/1939 | Flory | 427/74 |
| 2,439,647 | 4/1948 | Bromley | 313/542 |
| 2,538,588 | 1/1951 | Pakswer et al. | 313/541 |
| 3,672,987 | 6/1972 | O'Keeffe et al. | 313/542 |
| 3,960,620 | 6/1976 | Ettenberg | 313/542 |
| 4,005,465 | 1/1977 | Miller | 357/52 |

Primary Examiner—Jack I. Berman
Assistant Examiner—James E. Beyer
Attorney, Agent, or Firm—Staas & Halsey

[57] ABSTRACT

A photo cathode used for an electron image projection apparatus has a silver layer as a photo electric material and a layer of an alkali metal or alkaline earth metal, such as cesium, coated on the silver layer. The cesium is as thick as several atomic layers, and reduces the work function of the photo cathode. The silver layer may be coated all over a substrate, and portions other than the cathode may be masked by a non photoelectric metal, or non transparent metal, such as platinum. Or, the silver layer may be patterned on the layer of a non photoelectric metal coated on the substrate. An excitation light to the photo cathode may be irradiated onto the surface of the silver, or onto the back of the silver layer through a transparent substrate. After depositing the cesium layer on the silver, the layers are heated in a vacuum at 50° to 200° C., thus a contrast ratio, i.e. ratio of electron current from the cathode and from the non cathode portion, is achieved as high as 20. This low temperature heat processing prevents lateral diffusion of the mask metal, resulting in a sharp edge of the cathode pattern. Silver and the cesium thereon are not susceptive to open air atmosphere, thus allowing long life and easy handling for an efficient lithography processing. The low absorption edge of the silver allows the use of a high pressure mercury lamp whose light is easily focused by a lens.

9 Claims, 3 Drawing Sheets

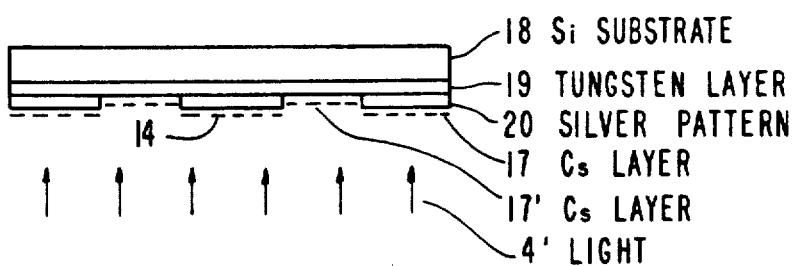
FIG. 6
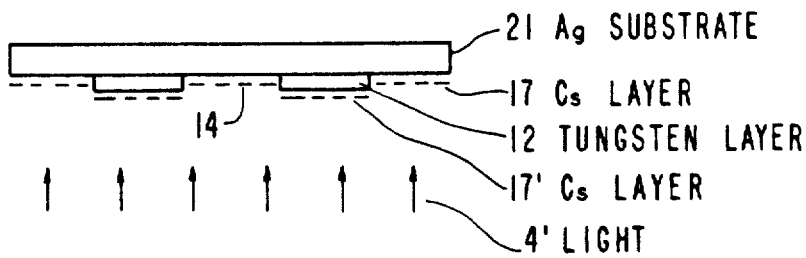
FIG. 7
FIG. 8
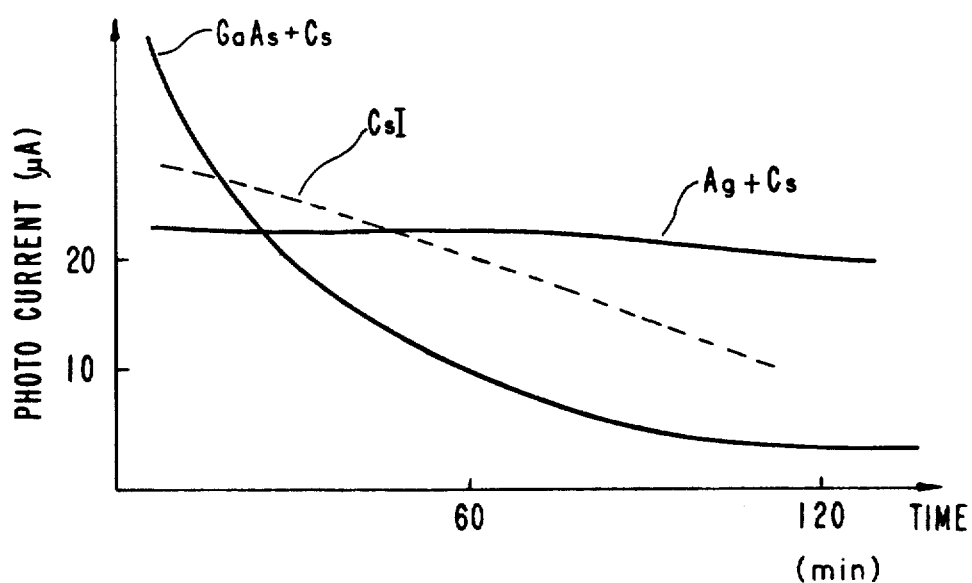

PATTERNED PHOTO CATHODE AND ITS FABRICATION METHOD FOR ELECTRON IMAGE PROJECTION

This is a continuation of co-pending application Ser. No. 07/086,510 filed on Aug. 18, 1987 now abandoned.

BACKGROUND OF THE INVENTION

1. Field of the Invention

This invention relates to a material of a photo cathode used in an electron image projection apparatus, in which electrons emitted from the patterned photo cathode are accelerated and focused on a surface of semiconductor wafer to be patterned, by a high voltage and magnetic field applied perpendicular to the surface of the mask as well as the wafer. More particularly, this invention relates to an improvement of the material in that it is more uniform, as well as less susceptive to the atmosphere, in characteristics.

2. Description of the Related Art

Photo lithography has been an important technique in the production of integrated circuits (IC). However, among the photo lithography techniques, in order to satisfy recent demand for a sub-micron resolution, an electron image projection technique was proposed by T. W. O'Keefe, et al in "An Electron Imaging System for the Fabrication of Integrated Circuits", Solid State Electron., vol.12, p.841, 1969. This subject and has been intensively studied and developed by many people, such as reported by I. Mori et al. in "An Electron Beam-Image-Projection System for Submicron", Toshiba Review, vol.41, No.5, 1986.

The main structure of the electron image projection apparatus in vacuum ($10^{-9}$ to $10^{-6}$ Torr) is schematically illustrated in FIG. 1. A mask substrate 11 which has been patterned in advance with a photo cathode material as will be described below is held by a mask holder 22. A semiconductor wafer 31 on which the pattern on the mask substrate 11 is to be copied is placed facing toward and parallel to the mask substrate 11 approximately 30 mm distant, on a wafer holder 30. An ultra violet light 38 of a proper wave length is irradiated onto the surface of the mask substrate 11, reflected by reflectors 36, or onto the back surface of the mask substrate made of a transparent material by the use of an apparatus which is not shown in figure. Then the patterned photo cathode is photo-electrically excited and emits photo electrons, which are accelerated by the applied voltage of approximately 80 KV between the mask substrate 11 and the wafer 31. This voltage 80 KV is applied by supplying −80 KV onto the mask substrate 11 and 0 V onto the wafer 31. On the other hand, a magnetic field is applied perpendicular to the surface of the mask substrate 11 as well as the wafer 31. The emitted and accelerated electrons 39 are thus accurately focused on the surface of the wafer 31 by the electric and magnetic field applied thereto. This magnetic field is applied from magnetic poles 33, 34 and a compensation coil 26 for providing a uniform magnetic field. An E-beam resist material, such as PMMA (poly methyl metacrylate), coated on the semiconductor wafer 31 is exposed by thus accelerated and focused electrons precisely the same as the pattern of the photo cathode on the mask substrate 11. This is the principle of the electron image projection.

As for the photo cathode material used for the electron image projection, there are two major types. The first one is CsI (cesium iodide) and the second one is a semiconductor material, such as GaAs (gallium arsenide), having Cs (cesium), etc. thereon, as previously applied by Yasuda et al. for U.S. patent application No. 799,321 now abandoned in favor of continuing U.S. patent application No. 144,275, now U.S. Pat. No. 4,789,786.

Structure of the first type of photo cathode using back-illuminating light is schematically illustrated in FIG. 2. Upon a substrate 15 which is made of quartz or sapphire and is therefore transparent to the illuminating ultra violet light, a Cr (chrome) layer is patterned as denoted by 12 by a conventional photo mask making technique, such as sputtering, an electron beam exposure and etching. Then, CsI is deposited upon all the surface of the patterned substrate 15, as denoted by 10 and 10'. An ultra violet light 4 is irradiated onto the back surface of the substrate 15, through which the light photo-electrically excites the CsI 10 coated directly on the substrate, indicated as a photo cathode 14 in FIG. 2. Then, the light-excited CsI 10 emits photo electrons, which are pulled out of the surface by the applied electric field. The Cr pattern 12 prevents light from arriving at the CsI layer 10' thereon. Thus, the photo cathode 14 is made patterned.

Structure of the second type of photo cathode using surface-irradiating light is schematically illustrated in FIG. 3. Upon a substrate 11 made of a photoelectric material, such as GaAs, which is not transparent to the illuminating light, a tungsten layer for masking a non cathode portion is patterned as indicated by the numeral 12' by a conventional lithography technique, such as sputtering, an electron beam exposure and etching. Then, several atomic layers of Cs 13 and 13' are coated all over the surface of the tungsten-patterned substrate 11. An ultra violet light 4' is irradiated onto the surface of the patterned substrate 11 having the Cs layer 13 directly thereon. Then a photo cathode portion 14, where the GaAs substrate 11 absorbs the irradiated light 4' through the Cs layer 13 and produces photo electrons therein, emits electrons, which are pulled out of the surface by the applied electric field. The tungsten pattern 12' having Cs atoms 13' thereon emits fewer photo electrons than the GaAs having Cs thereon. Thus, the photo cathode 14 is formed patterned.

Problems of the CsI are as follows. (1) The work function for emitting a photo electron is as high as approximately 6 eV, which requires a low-pressure mercury lamp as a light source emitting a light of approximately 1849 Å wave length for irradiating the photo cathode. However, there is no suitable focusing means available for the light of this wave length. (2) Life of CsI is not long enough for an efficient fabrication process of the ICs. It is because the CsI is not only very deliquescent but also reduces itself even in vacuum. This fact also makes it impossible to take out the CsI-coated mask into open air for example, inspection of the uniformity of the CsI coating.

Problems of the GaAs plus Cs is as follows. After a masking pattern is formed with tungsten etc. by a widely known method, such as sputtering, lithography and etching process, on the surface of the GaAs substrate, the surface of the GaAs substrate must be cleaned up by being heated at 630° C. or higher in a high vacuum, so that a contaminating material on the substrate is evaporated. Accordingly, the atoms of the substrate material can contact Cs atoms coated thereon for reducing the work function of the surface of the photo cathode. However, this heat cleaning is not always reliable to provide a satisfactorily clean surface. This causes less uniform, i.e. less stable, emissivity of the photo electrons therefrom. Further more, this heating process makes the masking metal diffuse laterally into the cathode portion 14 which is not masked thereby. Thus, the border line between the masked area and not-masked portion, i.e. 14, is made less sharp, namely blurring, by this diffusion of the masking metal. At this blurring edge portion, the emissivity of the photo electrons is deteriorated, resulting in a deterioration of the sharpness, i.e. resolution, of the image projection.

SUMMARY OF THE INVENTION

It is a general object of the invention, therefore to provide a photo cathode structure which is stable, i.e. less susceptive to the atmosphere and easy to handle for an efficient operation of the electron image projection.

It is another object of the invention to achieve a sub-micron resolution required in the fabrication of VLSI (very large scale IC).

According to the present invention, the photo cathode patterned on a mask substrate is made of a Ag (silver) layer and several atomic layers of an alkali metal or an alkaline earth metal coated on the Ag layer. The Ag layer may be coated all over the substrate surface, then the non-cathode portion may be masked with a pattern of a non photoelectric material, such as tungsten. Or, the Ag layer itself may be patterned same as the cathode pattern.

The photo cathode of the present invention allows the use of a mercury lamp of 3650 Å wave length, and can be less susceptive to the atmosphere, and stable to emit the electrons, resulting in easy and efficient operation of the lithography process.

The above-mentioned features and advantages of the present invention, together with other objects and advantages, which will become apparent, will be more fully described hereinafter, reference being made to the accompanying drawings forming a part hereof, wherein like numerals refer to like parts throughout.

BRIEF DESCRIPTION OF THE DRAWINGS

FIG. 6 schematically illustrates a cross-sectional view of a mask-substrate of another surface-illuminated type according to the present invention.

FIG. 7 schematically illustrates a cross-sectional view of a mask-substrate of another surface-illuminated type having a silver substrate according to the present invention.

FIG. 8 shows the life of the photo cathode of the present invention in comparison with the cathodes of an existing cathode.

DESCRIPTION OF THE PREFERRED EMBODIMENTS

Figure 1:
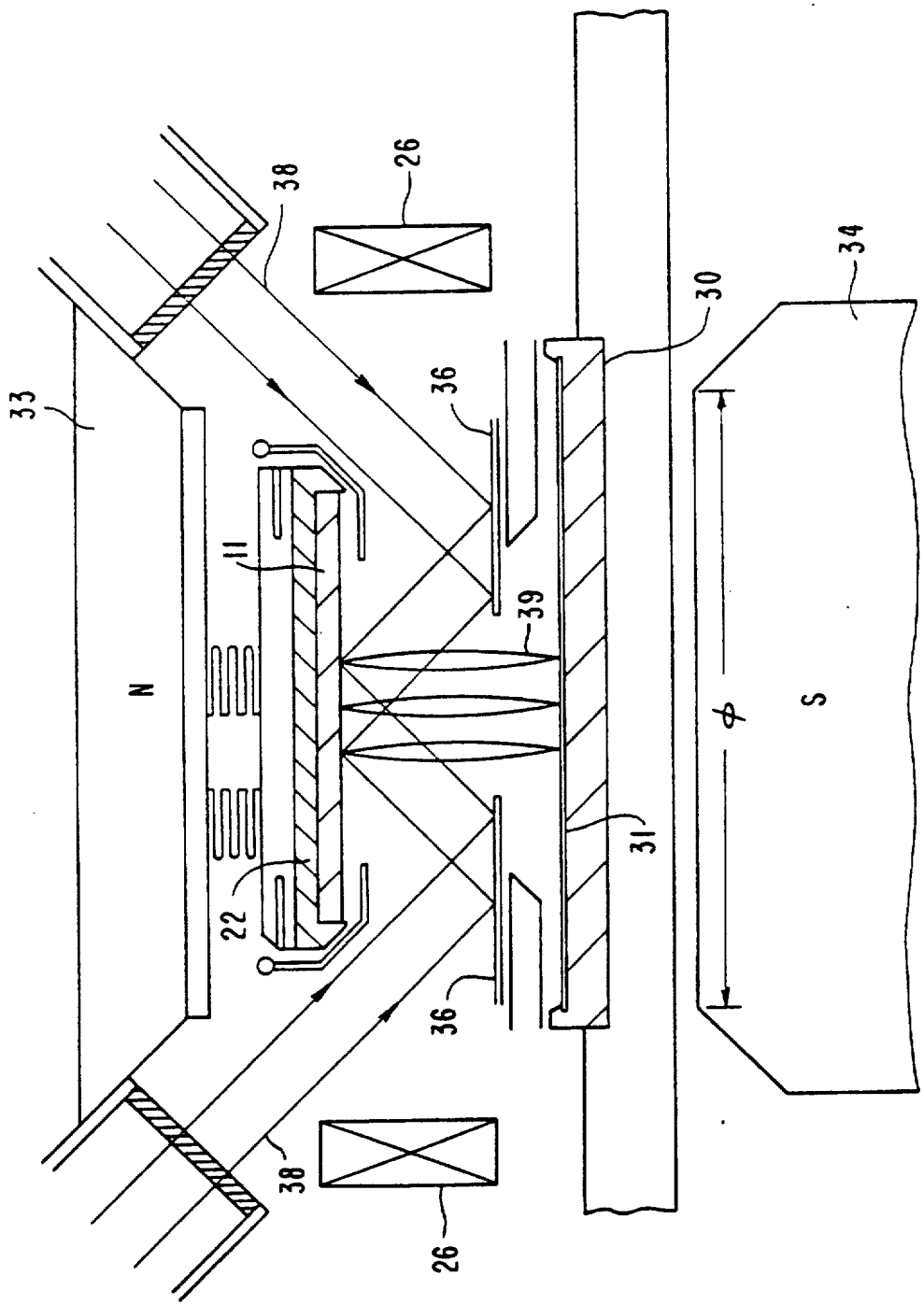
FIG. 1 schematically illustrates a general structure of the electron image projection apparatus of a surface illuminated type.
Figure 2:
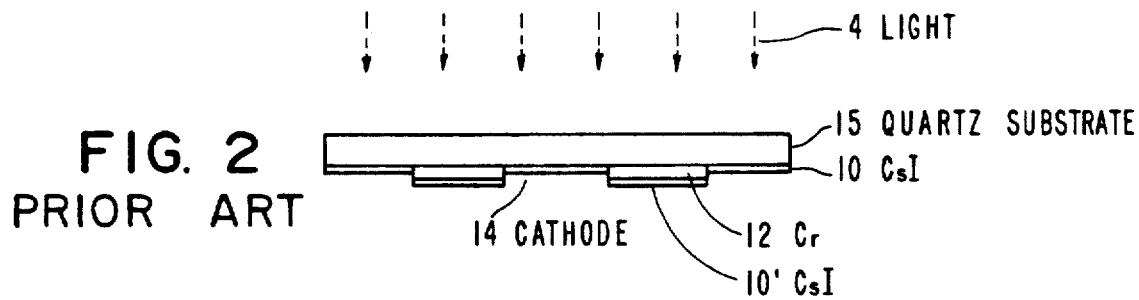
FIG. 2 schematically illustrates a cross-sectional view of an existing mask-substrate of either a back illuminated or front illuminated type using CsI as the photo cathode material.
Figure 3:
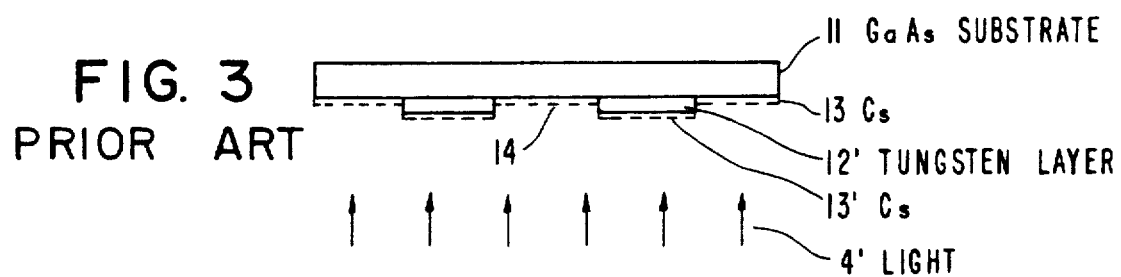
FIG. 3 schematically illustrates a cross-sectional view of an existing mask-substrate of a surface illuminated type using GaAs as the photo cathode material.
Figure 4:
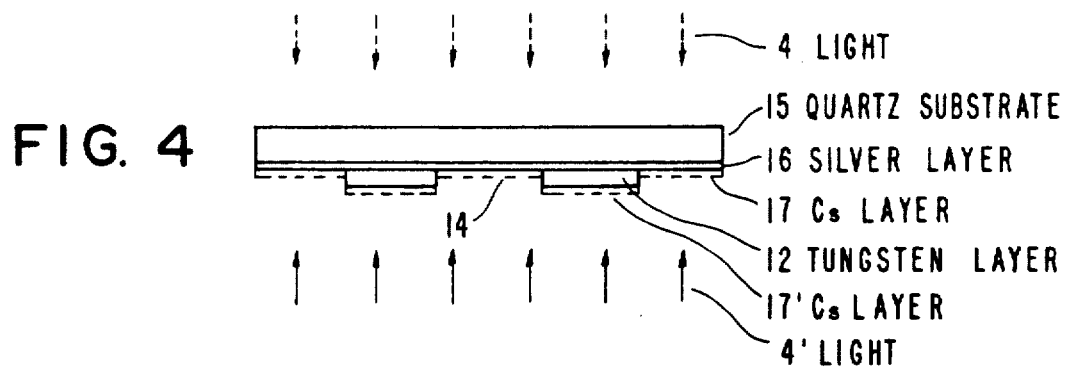
FIG. 4 schematically illustrates a cross-sectional view of a mask-substrate of a back or surface illuminated type according to the present invention.
Figure 5:
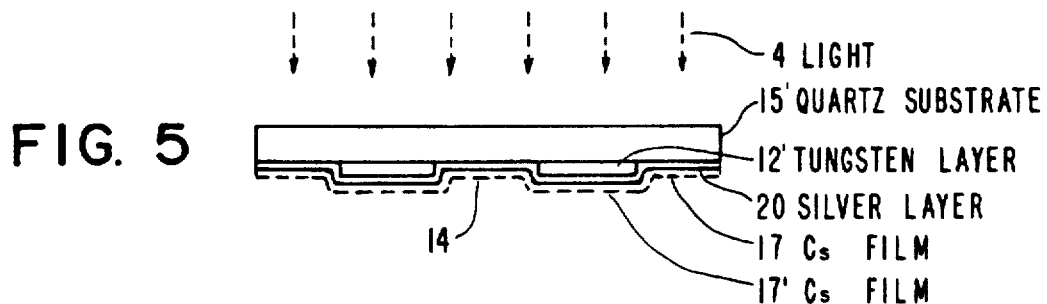
FIG. 5 schematically illustrates a cross-sectional view of a mask-substrate of a back-illuminated type according to the present invention.

First and second preferred embodiments of the photo cathode of the present invention are shown in FIGS. 4 and 5, respectively. In FIG. 4, for the first embodiment, upon all the surface of a substrate 15 made of a transparent material, such as quartz or sapphire, an Ag layer 16 is coated as thick as generally 150 Å (10 Å–1 μm), by a well known method, such as sputtering, vapor deposition or plating. If the Ag layer is thinner than 10 Å, the emissivity of the photo electron is not secured. A layer 12 of a non photoelectric material or a non transparent material such as Cr, Pt (platinum), Au (gold), W (tungsten), Mo (molybdenum), Ti (titanium), Ta (tantalum), etc., is patterned upon the Ag layer 16, as thick as generally 1000 Å (100–4000 Å), by a widely known lithography technique, such as a patterning for the E-beam lithography system. This pattern 12 or 12' is for masking locally a non-cathode portion. Then, a layer 17 and 17' of an alkali metal, such as Cs, K (potassium) or Rb (rubidium), or an alkaline earth metal, such as Ba (barium) or Ca (calcium) is coated all over the patterned substrate 15, as thick as several atomic layers by a widely known method. The alkali/alkaline earth metal shall be hereinafter represented by Cs in the following description. The method of this coating may be a widely known one, such as a cesium ion beam technique, an evaporation of cesium chromate or a commercially available so-called cesium dispenser. Heating the workpiece in a Cs vapor is also effective. Next, the substrate 15 having the Cs layer thereon is heated in vacuum at 50° C. to 200° C. for generally 1 to 10 minutes. If the heating time is too long, the exposure contrast is deteriorated because an excitation of the light plus the heat is also counted. If it is too short, its effect is not reliable, in other words the electron emissivity may become low. Thus processed substrate 15 having the Cs layer thereon is loaded in the electron image projection apparatus of FIG. 1, generally without being exposed to open air for better electron emissivity. This apparatus may be the one similar to that of FIG. 1, however, the light is injected from its back surface through the transparent substrate 15 onto the back of the Ag layer 16. Therefore, for this type of the photo cathode, the magnet poles 33, 34 are removed and replaced by magnet coils (not shown in the figures), in order to give up the occupying space for the light path. The light 4 or 4' irradiated onto the Ag layer 16 from either side, i.e. from the surface side or from the back side through the transparent substrate, excites the Ag layer 16, and produces photo electrons therein. The produced photo electrons are pulled out by the applied electric field to the surface, where the Cs coating helps the electrons go out of the cathode, because it reduces the work function of the cathode.

For the case where the Ag layer 16 is irradiated from the back side, if the Ag layer is too thick the produced photo electrons cannot reach the opposite surface from which the electrons are to be emitted. The covered portion of the Ag layer 16 by the masking metal pattern 12 also produces the photo electrons but does not emit them out into the vacuum, because the masking metal 12 having the Cs thereon is inactive to emit electrons therefrom. The produced photo electrons thereunder lose their scattering energy and finally vanish. If the masking pattern 12 is too thin, the irradiated light passes therethrough deteriorating the exposure contrast. However, if the masking pattern 12 is too thick the mask may cause no problem. Thus, the exposure contrast, i.e. the ratio of the electron current from the cathode portion and the electron current from the masked portion, is attained as high as approximately 20.

For the case where the photo cathode is irradiated from the outer side, the substrate 15 may be non transparent material. When too thick, the Ag layer may cause a problem. The pattern 12 of the masking metal shields the light 4' from the outside onto the Ag surface, thus the portion under the masking pattern 12 does not produce photo electrons unless it is too thin. If this light passes through the mask, the projected image becomes less sharp. If the masking pattern 12 is too thick, a shadow of the masking pattern onto the photo cathode portion deteriorates the sharpness of the projected image.

A third preferred embodiment of the cathode of the present invention is shown in FIG. 6. Over a substrate 18, which is not required to be transparent for the irradiating light, therefore, such as Si (silicon) which is the most available in this industry, a layer 19 of non photoelectric material, such as W, Mo, Cr, Pt, Au, Ti, Ta, and the like, is coated as thick as generally 2000 Å (100-4000 Å) by a well known method, such as sputtering. This layer acts as a conductor to supply electrons to the photo cathode. Next, upon this metal layer 19 an Ag layer 20 is patterned as thick as generally 1000 Å (500 Å-1 μm) by a widely known method, such as a lithography technique or a lift-off method, thus the pattern 20 of the Ag layer forms the pattern of the photo cathode 14. The thickness of the patterned Ag layer does not give a critical effect on the quality of the produced image. Then, Cs is deposited all over the Ag-patterned surface as thick as several atomic layers, by the same way as that of FIGS. 4 and 5. The photo cathode portion is thus formed as indicated by the numeral 14. Thus processed substrate 18 having a Cs layer thereon is loaded in the electron image projection apparatus of FIG. 1, usually without being exposed to an open air. The light 38 is irradiated onto the surface of the processed substrate 18. The electric field and the magnetic field are applied thereto similarly to the case of the photo cathode shown in FIGS. 4 and 5, then the patterned Ag layer 20 having Cs layer 17 thereon acts as a photo cathode 14 to emit photo electrons. Other portions, where the Cs layer 17' is directly deposited on the metal layer 19, emit a lesser amount of electrons than the Ag portion having the Cs thereon, in other words, a negligible amount of electrons is emitted therefrom.

Another type of embodiment of the present invention comprises the substrate 21 made of Ag as shown in FIG. 7. The Ag substrate 21 is in place of the substrate 18 having an Ag layer 16 thereon of FIG. 4. All other processes are the same as those of FIG. 4. The light 4' is irradiated only from the outside.

In either type of the photo cathode of the embodiments of the present invention, the advantages are as follows.

(1) Absorption edge of Ag is approximately 4 eV, which is lower than 6 eV of the CsI. This means that the light for exciting the photo electrons can be of 3000 to 4000 Å wave length, for example so-called "i line", i.e. 3650 Å. This wave length can be produced by a super high pressure mercury lamp, which can deliver a strong "i line" easy for focusing. On the other hand, a low pressure mercury lamp which delivers a relatively shorter wave length of light and is difficult focusing must be used for exciting the CsI. Therefore, the light having this 3000 to 4000 Å wave length can be easily focused by a lens, thus a high density light can be irradiated on the photo cathode in order to output a higher electron current.

(2) After the alkali/alkaline earth metal is coated over the Ag layer, the mask substrate is preferably heated at 50° C. to 200° C. as described above. This heat process remarkably improves the emissivity of the photo cathode, in fact, the photo electron current of 0.1 μA was increased up to 20 μA after the heat processing. This means a 200 times improvement, while other conditions, such as acceleration voltage, magnetic field or the light intensity, are kept the same as those of the existing apparatus. It is understood that the heat process makes purer and more stabilized contact between Ag and the coating material. This heat processing temperature is much lower than 630° C. to 680° C. required by the existing GaAs substrate having the same material, Cs, thereon for reducing the work function. Therefore, with this invention there is no problem of the existing GaAs substrate in that the diffusion caused by the high temperature process produces a less sharp cathode edge to the masked non cathode portion. Thus, resolution of 0.4 to 0.5 μm stably, and 0.15 to 0.3 μm at best, is easily achieved.

(3) The photo cathode of the present invention has a longer life than the existing GaAs photo cathode having a Cs layer thereon, as shown in FIG. 8, where the curve of the CsI is plotted with a free scale but indicates relation to other curves. As seen in the figure, when the photo cathodes are used in the vacuum apparatus of the electron image projection, the photo cathode of the present invention shows very slow decay for several tens of hours, while the existing GaAs photo cathode emits almost ten times of electrons only for the first several minutes but after that it decays very fast. The existing photo cathode using CsI is deliquescent and decays to a half level after the first several hours. Accordingly, the photo cathode of the present invention contributes to improve the throughput of the EB (electron beam) processing.

(4) Fluctuation of the emissivity of the photo electrons between the mask-substrates is improved from 30% of the existing GaAs cathode to within 10% for the cathode of the present invention of FIG. 4. This is achieved by the pure contact of the Cs atoms to the Ag base as well as the same reason described above in (3), and contributes to a uniform and quality fabrication of the product.

(5) Used mask-substrates can be re-used by re-deposition of alkali/alkaline earth metal thereon in vacuum. For reclamation of the existing GaAs substrate, it takes about 150 minutes because the substrate and the tools must be heated as high as 630° C. and must be cooled in vacuum. However, the mask-substrate according to the present invention can be cooled in only 3 minutes, because the heating temperature is much lower. This fact contributes to improve the throughput of the EB processing.

(6) The Ag substrate having alkali/alkaline earth metal thereon according to the present invention can be taken out of vacuum after the alkali/alkaline earth metal coating is carried out, because the Ag is not susceptive to the open air atmosphere. This fact allows a visible check of the processed surface of the photo cathode for its uniformity etc., and thus contributes to uniform and quality fabrication of the products. This is absolutely impossible for the CsI cathode because it is deliquescent.

(7) The photo cathode of the present invention enables both negative and positive EB exposure of resist, such as PMMA, which can withstand the atmosphere of dry etching.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What we claim is:

1. An electron image projection apparatus for projecting a predetermined electron beam pattern onto a semiconductor wafer, comprising:
   a vacuum chamber, the semiconductor wafer being exposed to the predetermined electron beam pattern in said vacuum chamber;
   a photo cathode including
     a substrate positioned in said vacuum chamber so that a surface of said substrate is generally parallel to and facing said semiconductor wafer,
     an essentially pure silver layer formed on said surface of said substrate, and having a work function
     a metal pattern layer formed on portions of said silver layer so as to define the predetermined electron beam pattern by forming a non-cathode portion, and
     a layer of metal chosen from a group consisting of alkali metals and alkaline earth metals formed on said silver layer so as to lower the work function of said silver layer;
   a power source for applying a positive voltage to the semiconductor wafer with respect to said substrate;
   a light source for irradiating light having a wavelength between about 3000 to about 4000 Å onto said photo cathode such that said photo cathode emits the predetermined electron beam pattern toward the semiconductor wafer upon application of said positive voltage and said light; and
   magnet means for applying a magnetic field perpendicular to said substrate and said semiconductor wafer said magnetic field focusing the predetermined electron beam pattern onto said surface of the semiconductor wafer.

2. An electron image projection apparatus as recited in claim 1, wherein said substrate includes a material transparent to said light and said metal pattern layer includes:
   a non-photoelectric metal pattern layer formed between portions of said silver layer and said layer of metal.

3. An electron image projection apparatus as recited in claim 2, wherein:
   said layer of metal is heat-treated at a temperature between 50° C. and 200° C.

4. An electron image projection apparatus as recited in claim 1, wherein said substrate includes a material transparent to said light and said metal pattern layer includes:
   a non-transparent metal pattern formed between portions of said substrate and said silver layer.

5. An electron image projection apparatus as recited in claim 4, wherein:
   said layer of metal is heat-treated at a temperature between 50° C. and 200° C.

6. An electron image projection apparatus for projecting a predetermined electron beam pattern onto a semiconductor wafer, comprising:
   a vacuum chamber, the semiconductor wafer being exposed to the predetermined electron beam pattern in said vacuum chamber;
   a photo cathode including
     a substrate positioned in said vacuum chamber so that a surface of said substrate is generally parallel to and facing said semiconductor wafer,
     a non-photoelectric metal layer coated entirely over a main portion of said surface of said substrate,
     an essentially pure silver layer having a work function patterned on portions of said non-photoelectric metal layer so as to define the predetermined electron beam pattern, and
     a layer of metal chosen from a group consisting of alkali metals and alkaline earth metals, formed on said silver layer so as to lower the work function of said silver layer;
   a power source for applying a positive voltage to the semiconductor wafer with respect to said substrate;
   a light source for irradiating light having a wavelength between about 3000 to about 4000 Å onto said photo cathode such that said photo cathode emits the predetermined electron beam pattern toward the semiconductor wafer upon application of said positive voltage and said light; and
   magnet means for applying a magnetic field perpendicular to said substrate and said semiconductor wafer said magnetic field focusing the predetermined electron beam pattern onto said surface of the semiconductor wafer.

7. An electron image projection apparatus as recited in claim 6, wherein:
   said layer of metal is heat-treated at a temperature between 50° C. and 200° C.

8. An electron image projection apparatus for projecting a predetermined electron beam pattern onto a semiconductor wafer, comprising:
   a vacuum chamber, the semiconductor wafer being exposed to the predetermined electron beam pattern in said vacuum chamber;
   a photo cathode including
     a substrate made of essentially pure silver, having a work function said substrate positioned in said vacuum chamber so that a surface of said substrate is generally parallel to and facing said semiconductor wafer,
     a non-photoelectric metal pattern layer formed on portions of said substrate so as to define the predetermined electron beam pattern by forming a non-cathode portion, and
     a layer of metal chosen from a group consisting of alkali metals and alkaline earth metals formed on said non-photoelectric metal pattern layer and exposed portions of said substrate so as to lower the work function of said substrate;

a power source for applying a positive voltage to the semiconductor wafer with respect to said substrate;

a light source for irradiating light having a wavelength between about 3000 to about 4000 Å onto said photo cathode such that said photo cathode emits the predetermined electron beam pattern toward the semiconductor wafer upon application of said positive voltage and said light; and magnet means for applying a magnetic field perpendicular to said substrate and said semiconductor wafer said magnetic field focusing the predetermined electron beam pattern onto said surface of the semiconductor wafer.

9. An electron image projection apparatus as recited in claim 8, wherein:

said layer of metal is heat-treated at a temperature between 50° C. and 200° C.

* * * * *

UNITED STATES PATENT AND TRADEMARK OFFICE
CERTIFICATE OF CORRECTION

PATENT NO. : 5,118,952
DATED : June 2, 1992
INVENTOR(S) : Kiichi Sakamoto, et al It is certified that error appears in the above-indentified patent and that said Letters Patent is hereby corrected as shown below:

Column 1, line 29, delete "and"

Column 7, line 35, after "tion" insert --,--

Signed and Sealed this

Eighth Day of February, 1994

Attest:

BRUCE LEHMAN

*Attesting Officer*      *Commissioner of Patents and Trademarks*